United States Patent [19]

Nolde et al.

[11] Patent Number: 4,607,392

[45] Date of Patent: Aug. 19, 1986

[54] CIRCUIT FOR IMPROVING THE TUNING BEHAVIOR OF A RECEIVER FREQUENCY CONTROL LOOP

[75] Inventors: Wolfgang Nolde, Hamburg, Fed. Rep. of Germany; Wolfdietrich G. Kasperkovitz, Waalre, Netherlands

[73] Assignee: U.S. Philips Corporation, New York, N.Y.

[21] Appl. No.: 637,178

[22] Filed: Aug. 2, 1984

[30] Foreign Application Priority Data

Aug. 8, 1983 [DE] Fed. Rep. of Germany ....... 3328555

[51] Int. Cl.[4] .......................... H04B 1/26; H04B 1/10
[52] U.S. Cl. ................................... 455/192; 455/194; 455/249; 455/263
[58] Field of Search ............. 455/208, 182, 192, 240, 455/194, 249, 258, 261, 263, 264; 375/97

[56] References Cited

U.S. PATENT DOCUMENTS

| | | | |
|---|---|---|---|
| 3,619,492 | 11/1971 | Evans | 455/194 |
| 3,678,394 | 7/1972 | Ebisch | 455/263 |
| 3,869,674 | 3/1975 | Borbely | 455/208 |
| 3,965,423 | 6/1976 | Fish, Jr. | 455/192 |

FOREIGN PATENT DOCUMENTS

0006409  1/1979  Japan ................................ 455/263

Primary Examiner—Marc E. Bookbinder
Attorney, Agent, or Firm—Thomas A. Briody; Jack Oisher; William J. Streeter

[57] ABSTRACT

The invention relates to a receiver circuit comprising a loop in which the oscillator frequency is controlled by the useful signal. The loop gain in the useful tuning range is negative and greater than unity. An attenuator is provided which is controlled by a control circuit so that larger deviations of the intermediate frequency loop from a target value result in the loop gain being reduced, improving the receiver tuning behaviour.

6 Claims, 17 Drawing Figures

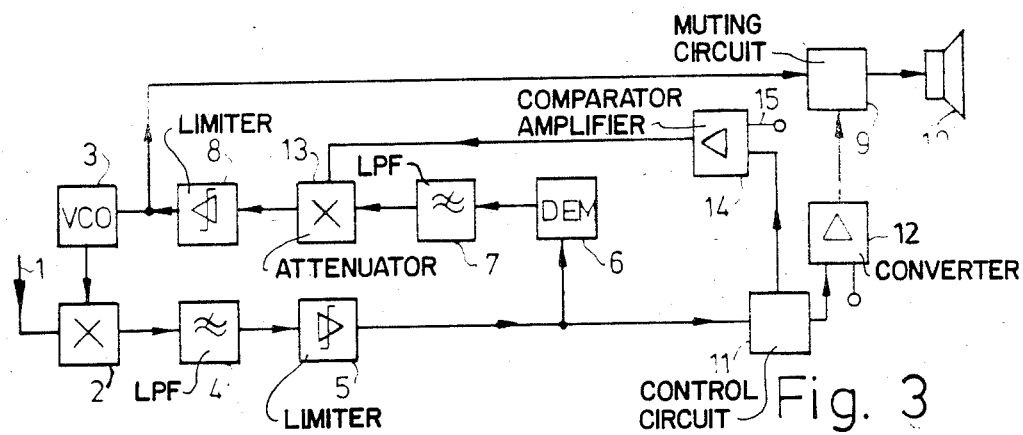
Fig. 3
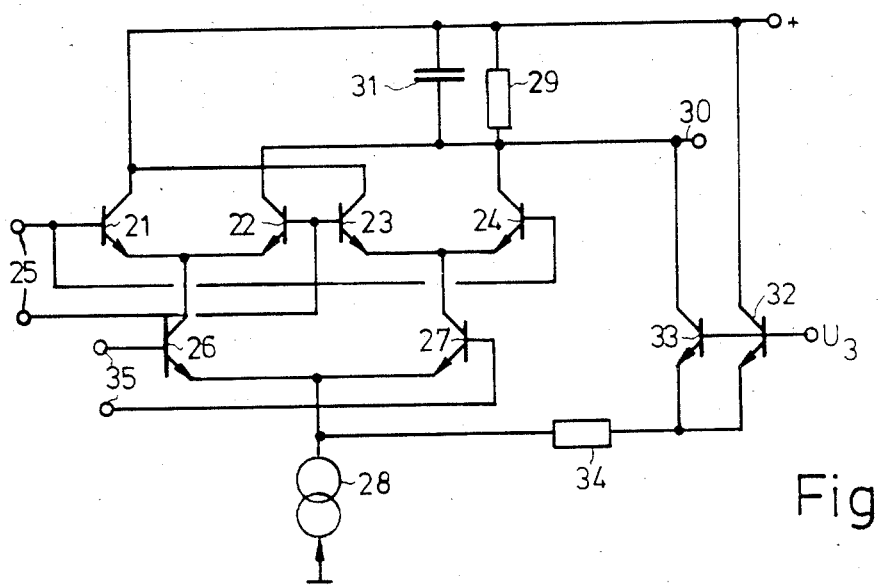
Fig. 5
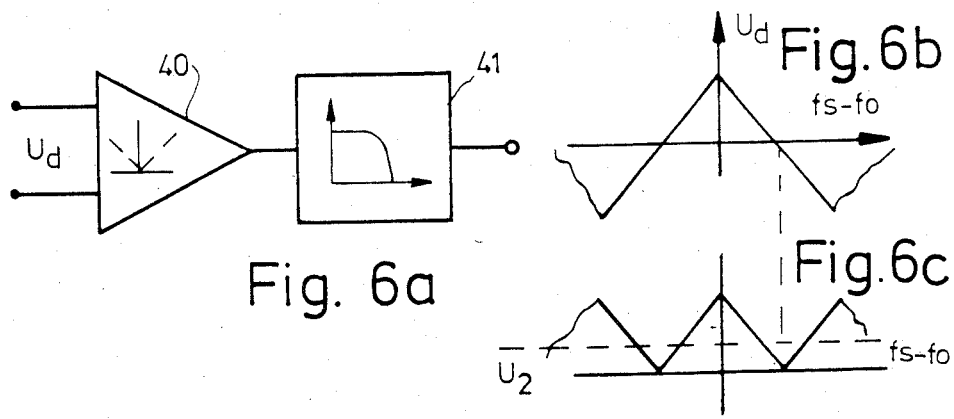
Fig. 6a
Fig. 6b
Fig. 6c

CIRCUIT FOR IMPROVING THE TUNING BEHAVIOR OF A RECEIVER FREQUENCY CONTROL LOOP

The invention relates to a receiver circuit comprising an oscillator for tuning the receiver circuit over a certain tuning range, whose frequency is in addition controllable by a voltage applied to a control input. A mixer stage mixes the oscillator signal with an aerial signal and forms an intermediate-frequency signal therefrom. A frequency-voltage converter receives the intermediate-frequency signal and from the output signal a signal for the control input of the oscillator is derived. A control circuit produces a control signal which depends on the instantaneous deviation of the frequency of the intermediate-frequency signal from a mean value. Such a receiver circuit is disclosed in DE-A No. 30 32 701.6 and its corresponding U.S. Pat. No. 4,426,735.

Such a receiver circuit is intended in the first place to receive frequency-modulated signals, though it can in principle receive amplitude-modulated signals. The oscillator, the mixer and the frequency-voltage converter form a loop whose loop gain in a useful tuning range is negative and greater than unity (for example 4). As a result the frequency deviation of the intermediate-frequency signal is significantly reduced with respect to the frequency deviation of the aerial signal (at a negative loop gain of 4, by a factor of 5). It is then possible to choose a low mean value (for example 70 kHz) for the intermediate frequency signal which is essentially determined by the design of the frequency-voltage converter, such that a simple RC-low-pass filter is sufficient for selecting the intermediate frequency signal. Consequently, circuits of this type are particularly suitable for integrated circuitry.

In a circuit of this type there are two stable tuning ranges, the (wanted) useful tuning range around the target mean frequency and an (unwanted) tuning range on a side band in the region of the image frequency. With the prior art circuit the tuning on this unwanted tuning range is suppressed with the aid of a muting circuit which is controlled by the control circuit and is arranged in the signal path of the demodulated wanted signal.

A disadvantage of the prior art circuit is that it has an unusual tuning behaviour. More specifically, the tuning is highly asymmetrical, that is to say the extent of the tuning range and its position relative to the target mean frequency greatly depend on whether a higher or a lower frequency is taken as the initial point during tuning. A further disadvantage is that during the reception of FM-signals tuning positions are possible in which no output signal and substantially no noise are present. This may be confusing for a user of such a receiver, as he does not recognize this behaviour from conventional receivers.

SUMMARY OF THE INVENTION

It is an object of the present invention to provide an improvement on a receiver circuit such that a highly symmetrical tuning behaviour is obtained.

According to the invention, this object is accomplished with a controllable attenuator controlling the loop gain in the loop formed by the oscillator, the mixer and the frequency-voltage converter the control circuit 11 increasing the attenuation of the attenuator when the intermediate frequency deviates from the target means frequency, by more than a minimum value.

When tuning is effected to the wanted tuning range around the target mean frequency, the loop gain remains unchanged so that the frequency deviation compression and the further advantageous properties of the circuit in this range are maintained. In the case of greater detuning the loop gain is however reduced, so that a symmetrical tuning behaviour is obtained. The reduction is however less than the maximum value of the gain.

In accordance with a further embodiment of the invention the control circuit includes a correlator, the correlation period corresponding to half a period of the target mean value of the intermediate frequency. As is known, a correlator is a circuit in which the momentary means value of the product of an oscillation signal and the oscillation signal being delayed by the correlation period is formed. In this case the correlation period corresponds to half a cycle of the target mean frequency, that is to say that at the target mean frequency the signals to be multiplied have a phase shift of precisely 180°.

The attenuator can be controlled by the control signal of the control circuit in the switched mode (with sudden transients) but alternatively in the analog mode (continuously). The attenuator itself can be directly included in the loop so that the loop is closed through the attenuator, whose gain or attenuation, respectively is then controlled by the control circuit. However, in accordance with a preferred embodiment of the invention, the frequency-voltage converter comprises a multiplying circuit the gain thereof being controlled by the control circuit. In this case the attenuator is not included directly in the loop, but only influences the gain of a circuit in the loop. This structure results in lower additional costs.

The complexity may still further be reduced in accordance with an improved embodiment of the invention, when a muting circuit is provided for fully or partially suppressing the reproduction of the useful signal derived from the aerial signal. The control circuit controls the muting circuit outside the attenuator such that the muting circuit is activated when the intermediate frequency deviates from the target mean frequency by a predetermined amount. The muting circuit and the control circuit controlling are also already in the prior art receiver circuit.

DESCRIPTION OF THE FIGURES

The invention will now be further described by way of example with reference to the accompanying drawing in which FIG. 3 shows a block diagram of an embodiment of the circuit according to the invention, FIG. 5 shows a particularly simple embodiment of an attenuator in combination with a demodulator, FIG. 6a shows an embodiment of a control circuit, FIGS. 6b and 6c show the voltage variations resulting from the control circuit of FIG. 6a.

DESCRIPTION OF THE PREFERRED EMBODIMENT

Figure 1:
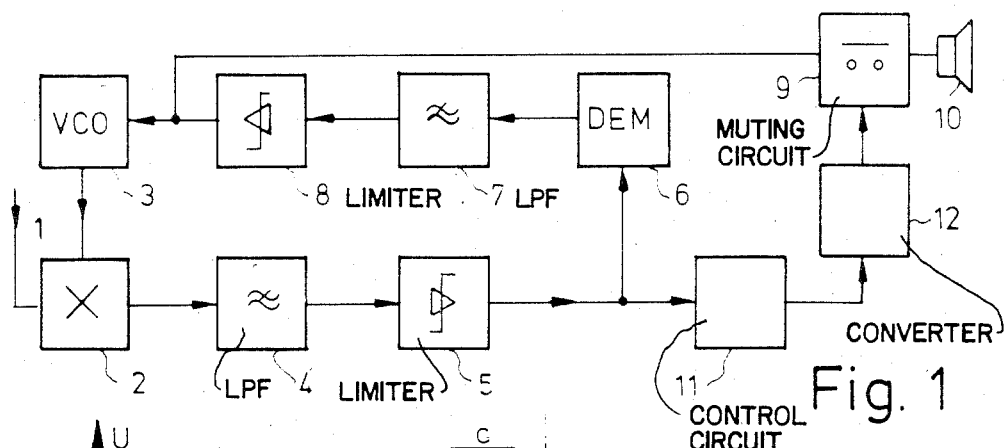
FIG. 1 shows a block diagram of the prior art receiver circuit.

FIG. 1 shows the block circuit of a prior art FM-receiver. Reference numeral 1 denotes an aerial whose RF-signal is applied to a mixer 2 in which it is mixed with the signal from a voltage controlled oscillator (VCO) 3. The VCO 3 frequency is linearly controllable by a voltage and which can be tuned in usual manner, for example by means of a variable capacitor. The intermediate-frequency signal produced by the mixer 2 is applied to a low-pass filter 4 whose cut-off frequency is approximately 100 kHz, so that it suppresses signals from adjacent transmitters and especially mixing products having the sum frequency of the aerial and the oscillator signal. The output of the low-pass filter 4 is connected to a limiter-amplifier 5, whose output signal is applied to a frequency demodulator 6 which functions as a frequency-voltage converter. The frequency-voltage converter is designed for an intermediate mean frequency $f_{zo}$ of, for example, 70 kHz, that is to say the demodulator output signal has zero value for this mean frequency and changes approximately linearly with the deviation of the intermediate frequency from this so-called target mean value. The output signal of the FM-demodulator 6 is applied to a low-pass filter 7, which is used to stabilize the loop. The loop cut-off frequency in relationship with the open loop gain is chosen such, that the bandwidth of the closed loop comprises the useful signal only, said cut-off frequency then being lower than that of the useful signal. The output of the low-pass filter 7 is connected to the input of a limiter-amplifier 8 from whose output the signal is taken and which is simultaneously connected to the control input of the voltage-controlled oscillator 3, so that the oscillator frequency changes dependent on the amplitude deviations of the audio signal. The audio signal is applied to a reproducing unit 10, for example a loudspeaker, through a muting circuit 9 and optionally through an amplifier, not shown. The muting circuit 9 is controlled by a control circuit through a suitable converter stage 12, for example an amplifier having a very high gain. The control circuit 11 has a comparatively large time constant and effects an attenuation or suppression, respectively of the reproduction when the intermediate frequency deviates from the mean target value $f_{zo}$ by a predetermined amount. The control circuit 11 may be of the same construction as the correlator in the circuit disclosed in DE-A No. 30 32 701.6 and its U.S. counterpart, U.S. Pat. No. 4,426,735, hereby incorporated by reference. More specifically the demodulator 6 and the control circuit 11—as is also the case in the prior art receiver may have a portion of the phase shifter in common.

Figure 2A:
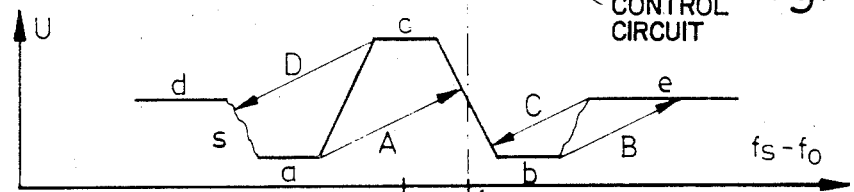
FIGS. 2a to 2c show different diagrams, which illustrate the tuning behaviour of the circuit shown in FIG. 1.

To explain the operation of the circuits shown in FIG. 1, reference is made to FIGS. 2a to 2e. In FIG. 2a the output voltage U of the limiter-amplifier 8 is shown as a function of the difference $f_s - f_o$ between the transmitter frequency $f_s$ and the oscllator frequency $f_o$, with the loop being opened before the control input of the oscillator. This characteristic is symmetrical around the point $f_s = f_o$ ($f_s - f_o = 0$). In the outer regions, that is to say for difference frequencies ($f_s - f_o$) exceeding a predetermined amount, the curves have horizontally extending regions d and e in which the output voltage U of the limiter-amplifier is independent of the differences between transmitter and oscillator frequencies. The position of these two regions, that is to say their mutual frequency distance is determined by the design of the low-pass filter 4 (FIG. 1). The higher the cut-off frequency is, the larger the distance between these two curve sections. Therebetween, that is to say at lower difference frequencies ($f_s - f_o$), there are still further horizontally extending curve sections, namely the sections a, b and c. These sections are produced by the limiter 8. As in these regions the change in the difference between the transmitter and oscillator frequencies do not influence the output voltage and consequently do not influence the frequency of the oscillator 3, the closed loop gain is here zero. If in addition thereto a frequency-modulated signal is received in the regions a, b or c, the noise is suppressed and no signal is audible at the loudspeaker 10. The frequency modulation, that is to say the change in the instantaneous value of the transmitter frequency in correspondence with the instantaneous value of the signal has no influence on the output voltage.

In addition, the curve has two regions with a negative slope, in which therefore the output violtage U decreases versus an increasing intermediate frequency. These regions are the region s and the region around the target mean frequency $f_{zo}$ in which the transmitter frequency exceeds the oscillator frequency ($f_s - f_o 0$). Let it be assumed that the (closed) loop is designed such that a negative loop gain is obtained at this negative slope, namely such that the loop gain around the frequency $f_{zo}$ is less than $-1$, for example $-4$. This implies that each change in the instantaneous value of the transmitter frequency, that is to say any frequency modulation, results in a change in the limiter-output voltage U and consequently in the oscillator frequency $f_o$ such that the difference between the instantaneous value of the transmitter frequency and the instantaneous value of the oscillator frequency is reduced, which is similar to the situation in which the frequency deviation of the intermediate frequency signal at the output of the mixer 2 is less than the frequency deviation of the transmitter signal. So with a loop gain of $-4$ the frequency deviation is reduced by a factor of 5. For this reason it is possible to receive with such a circuit in which the intermediate frequency has a nominal value $f_{zo}$ of only 70 kHz, an RF-FM signal whose frequency deviation is, as is known, 75 kHz, without non-linear distortions being produced because of the band limitation.

As the output voltage U varies symmetrically around the straight line $f_s = f_o$, the curve also has two regions with positive slopes. The region in which the transmitter frequency is less than the oscillator frequency by the value $f_{zo}(f_s - f_o = -f_{zo})$ then has in the assumed example a cloud loop gain of $+4$. This implicates that tuning to one of these regions having a positive loop gain which is greater than 1 is not possible, as the loop is here unstable, so that this region is skipped during tuning as will be described hereinafter.

Figure 2B:
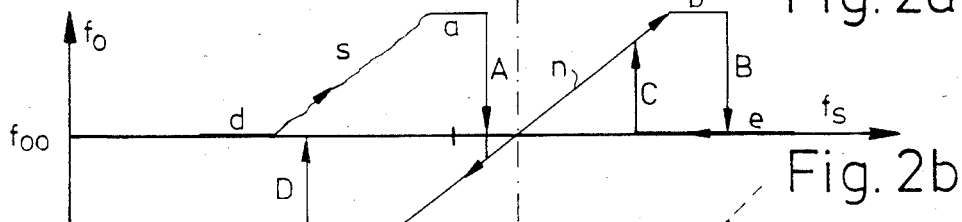
Figure 2C:
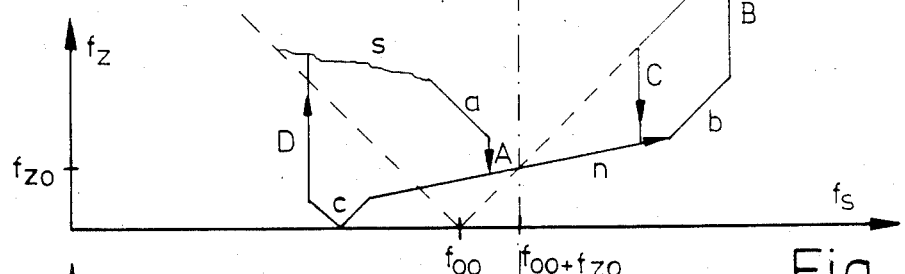
Figure 2D:
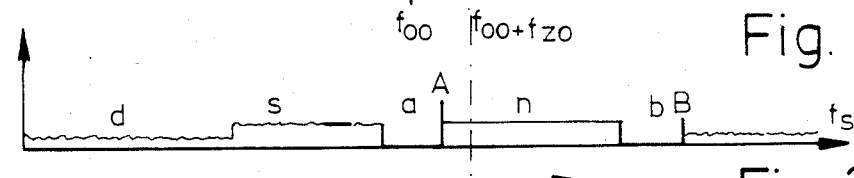

FIGS. 2b to 2d show the closed loop behaviour of the receiver as a function of the transmitter frequency $f_s$, for the sake of simplicity with the description that when tuning is effected to the regions d and e the oscillator frequency $f_o$ has the constant initial value $f_{oo}$ and that only the unmodulated carrier frequency $f_s$ of the transmitter is received. From FIG. 2b which shows the dependence of the oscillator frequency $f_o$ on $f_s$ it will then be obvious that in the region d in which the transmitter frequency $f_s$ is adequately far below the oscillator frequency $f_o = f_{oo}$, an increase of the transmitter frequency $f_s$ does not influence the oscillator frequency $f_o$. FIG. 2c which illustrates the dependence of the intermediate frequency $f_z$ on the transmitter frequency $f_s$ shows that consequently the intermediate frequency $f_z$ always decreases by the same amount by which the transmitter frequency $f_s$ increases, so that in this region a straight line, shown by means of a broken line, having a slope of $-45°$ is obtained. FIG. 2b which characterizes the type of useful signal at the input of the muting circuit 9 as a function of the transmitter frequency $f_s$ increasing shows that only noise can be received in region d.

This region ends when the transmitter frequency $f_s$ has increased to such an extent that the (negative) difference between the transmitter frequency $f_s$ and the oscillator frequency $f_o$ has decreased to such an extent that the resulting difference frequency is transmitted by the low-pass filter 4. The tuning then arrives in the region s in which the oscillator frequency $f_o$ increases versus the transmitter frequency $f_s$ (FIG. 2b), but because of the finite loop gain not to the same extent as the transmitter frequency $f_s$. As a result there now results a further—but smaller—decrease in the intermediate frequency $f_z$ (FIG. 2c). In this region, in which tuning is effected to an edge of the low-pass filter a demodulation of the input signal is obtained, but with poorer signal-to-noise ratios.

When the oscillator frequency reaches the value at which the voltage U, which controls the oscillator frequency, corresponds to the level a, the oscillator frequency $f_o$ at first no longer increases with an increasing transmitter frequency $f_s$ (FIG. 2b). The intermediate frequency $f_z$ again decreases by the same amount with which the transmitter frequency $f_s$ increases (FIG. 2c). As explained in the foregoing, no output signal is however obtained in region a, not even when the transmitter signal is frequency-modulated.

When region a has been passed through there follows the region having a positive loop gain which, as mentioned in the foregoing, is not stable. As a result thereof the oscillator frequency $f_o$ changes suddenly versus the transmitter frequency $f_s$ (FIG. 2b jump A) and also the intermediate frequency $f_z$ (FIG. 2c). Then not only the total region with a positive loop gain is skipped, but also the region c and even a portion of the useful tuning region n around the frequency at which the transmitter frequency $f_s$ is equal to the sum of the constant oscillator frequency $f_{oo}$ and the target mean value of the intermediate frequency $f_{zo}$. This jump A increases when the loop gain is increased and vice versa. At a higher loop gain the ideal transmitter tuning ($f_s = f_{oo} + f_{zo}$) may even be skipped. After this jump, by which the region n with the negative loop gain is reached, the oscillator frequency $f_o$ versus the transmitter frequency $f_s$ changes, but because of the finite loop gain to a lesser extent than the transmitter frequency $f_s$. The oscillator frequency $f_o$ again reaches the initial value $f_{oo}$ at the transmitter frequency $f_s = f_{oo} + f_{zo}$ and thereafter increases further in an essentially linear way. In this useful tuning range any change in the transmitter frequency is converted into a change in the output voltage U of the limiter-amplifier 8, that is to say a frequency-modulated signal is demodulated.

Region n ends when the transmitter frequency $f_s$ has become so much higher than the oscillator frequency $f_o$ that the region b is reached. In region b the oscillator frequency $f_o$ does not change anymore (FIG. 2b). The intermediate frequency $f_z$ increases to the same extent as the transmitter frequency $f_s$ (FIG. 2c), and no signal is received at the input of the muting circuit (FIG. 2d).

Region b is followed by a region of a positive loop gain, in which the oscillator frequency $f_o$ or the intermediate frequency $f_z$, respectively suddenly, already at a very small change in the transmitter frequency $f_s$ (or—when the assumption that the transmitter frequency $f_s$ changes and the oscillator frequency $f_o$ remains constant is left—at a very small decrease of the oscillator frequency $f_o$), skips a portion of the horizontally extending region e again until the oscillator frequency $f_o$ reaches the initial constant value $f_{oo}$. With a still further increasing transmitter frequency $f_s$ the oscillator frequency $f_o$ changes no more and a noise signal is produced at the input of the muting circuit 9.

Figure 2E:
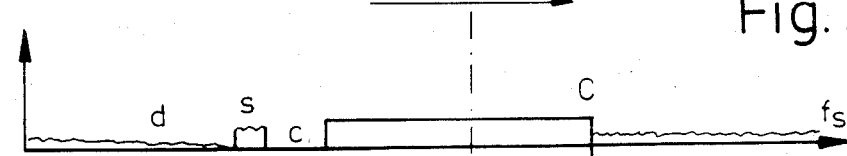

If the transmitter frequency is decreased, starting from higher values, a quite different tuning behaviour is obtained. In the first place the region e is again passed through—to its very end—the oscillator frequency $f_o$ remaining constant ($f_{oo}$), while the intermediate frequency $f_z$ decreases versus the transmitter frequency $f_s$. A noise signal appears at the input of the muting circuit 9 (FIG. 2e). This region ends when the region of the positive loop gain is reached, which region is determined by the edges of the low-pass filter 4. Then a jump C of the oscillator frequency $f_o$ or the intermediate frequency $f_z$, respectively occurs, the region B (FIG. 2a) being skipped entirely and also a small portion of the useful tuning range. From there the oscillator frequency $f_o$ follows the transmitter frequency on the line n (FIG. 2b). The intermediate frequency decreases slightly (FIG. 2c), until the overall tuning range n is passed through and the portion c follows in which the oscillator frequency $f_o$ stops changing (FIG. 2b). The intermediate frequency $f_z$ decreases to the same extent as the transmitter frequency, subsequently increases again during which no signal appears at the input of the muting circuit (FIG. 2e) until finally the beginning of the curve portion with a positive loop gain is reached.

In the case of a still further increase the tuning then skips this region, the subsequent region a and a large portion of the next region having a negative loop gain. Only the small remaining portion of the tuning range s determined by the filter edges is passed through. Range s follows after the range d in which the initial tuning $f_{oo}$ is reached, whereafter no further change in the oscillator frequency $f_o$ occurs (FIG. 2b) and only a noise signal is still applied to the muting circuit 9 (FIG. 2e).

A comparison between the FIGS. 2d and 2e shows that the tuning behaviour depends on the direction the tuning range is passed through. It will be obvious that the useful tuning range n in FIG. 2d is located highly asymmetrically relative to the correct tuning frequency $f_s = f_{oo} + f_{zo}$. The muting ranges a, b and c are confusing for the user. The muting circuit 9 controlled by the control circuit 11 can only partly suppress the above-described effects and does not influence the asymmetrical tuning behaviour.

The circuit according to the embodiment of the invention shown in FIG. 3 differs from the prior art circuit in that an attenuator 13 is arranged between the output of the low-pass filter 7, which follows the FM demodulator 6, and the input of the limiter-amplifier 8 which controls the frequency of the oscillator 3. The attenuator 13 is controlled by the control circuit 11 through an amplifier 14. The rest the circuit comprises the same components as FIG. 1, for which reason the same reference numerals are used. It is self-evident, that the initial attenuation or gain, of the attenuator 13 should be chosen in combination with the transfer function of the other components in the loop such that approximately the same loop gain is obtained as in the circuit shown in FIG. 1.

Figure 4A:
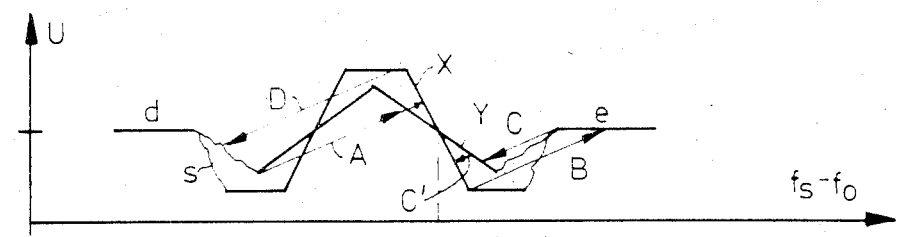
FIG. 4 shows different diagrams which illustrate the tuning behaviour of the circuit shown in FIG. 3.

As a result thereof, in open loop condition, the output signal U varies with the difference between the transmitter frequency $f_s$ and the oscillator frequency $f_o$ according to the variation as shown in FIG. 4a with curve x. Curve x corresponds with the variation as shown in FIG. 2a when the attenuator 13 is inoperative or operative only at its initial attenuation. When however the attenuator 13 is operative and its attenuation is at a maximum, its gain is reduced to such a low value that no limitation occurs anymore—compare FIG. 4a, curve y). The increase in the attenuation or the reduction in the gain must however be limited to such a value that the loop gain in the useful tuning range n and in the mirror-inverted range must remain higher than 1. Only then is the possibility excluded that tuning can be effected to a region having a positive loop gain.

Figure 4B:
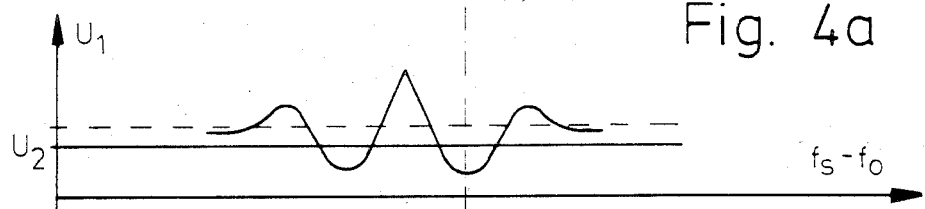

FIG. 4b shows the variation of the output voltage $U_1$ of the control circuit 11 as a function of the difference between the transmitter frequency $f_s$ and the oscillator frequency $f_o$. The control circuit 11 may be, as in the prior art circuit, a correlator comprising a low-pass filter which integrates the output voltage of a multiplier to an average value. One input is directly supplied with the intermediate frequency $f_z$ from the output of the limiter-amplifier 5, and the other input is supplied by the intermediate frequency signal $f_z$, phase shifted with a phase shift which depends linearly on the frequency. The phase shift is 180° at the target mean value $f_{zo}$ of the intermediate frequency. A curve, shown in FIG. 4b, is then obtained which is symmetrical to the point $f_s = f_o$ and which has its minimum values when the difference frequency $(f_s - f_o)$ equalizes to the amount of $f_{zo}(f_s - f_o = \pm f_{zo})$. The output voltage $U_1$ is amplified by the amplifier 14 and compared to the voltage at its reference input 15, resulting in a difference signal whose magnitude depends on the choice of the voltage $U_2$ (cf. FIG. 4b broken line and solid line). This difference signal is amplified in a region around the target mean value $f_{zo}$, resulting in a control voltage which maintains the loop gain at its initial value, whilst in the outside regions of the intermediate frequency it is reduced. This effects an essential change in the tuning behaviour of the circuit as will be obvious from the FIGS. 4c to 4e.

Figure 4C:
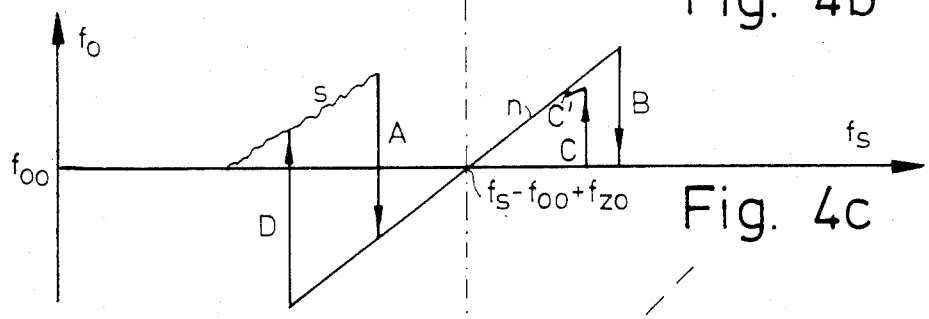
Figure 4D:
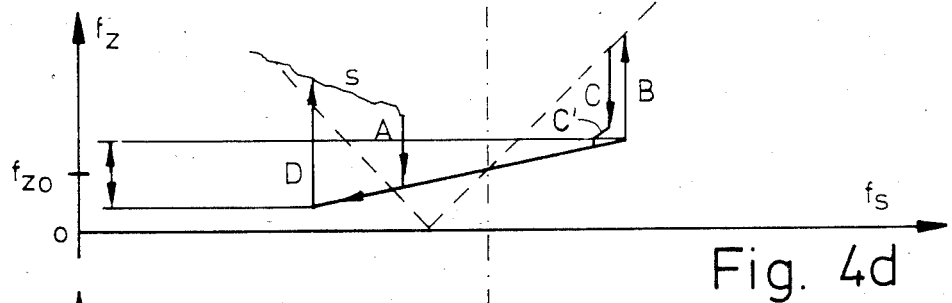

FIG. 4c shows the variation of the oscillator frequency $f_o$ as a function of the transmitter frequency $f_s$, it again being assumed that the oscillator is not tuned, whilst the transmitter frequency $f_s$ is changed. At relatively low transmitter frequencies $f_s$ the oscillator frequency $f_o$ is at first not changed, until the region s is reached. In this region or in a portion of this region—depending on the value of the reference voltage $U_2$—the output voltage $U_1$ of the control circuit 11 exceeds the reference value $U_2$ so that the attenuator 13 is made operative and the loop gain is reduced. As a result thereof the oscillator frequency $f_o$ here indeed follows the transmitter frequency $f_s$ (FIG. 4c), but not to the same extent as in the circuit shown in FIG. 1 (cf. FIG. 2c), until a lower value is reached which corresponds to the minimum of the curve y (FIG. 4a).

This is immediately followed by the region having a positive loop gain, which results in a frequency jump A ending in the useful tuning range n, as the loop gain is greater than unity also when the attenuator is operative. Although in this useful tuning range the output voltage $U_1$ of the control circuit 11 should be below the reference voltage $U_2$, resulting in the attenuator 13 being inoperative so that the initial loop gain is attained, the attenuator is at first still operative, as the voltage $U_1$ changes only comparatively slowly because of the relatively large time constants of the control circuit 11 (0.1 sec. or longer). This means that the loop gain becomes gradually greater, which results in a further increase of the oscillator frequency $f_o$ without a change in the transmitter frequency $f_s$ until finally the attenuator 13 is not operative and the initial loop gain is attained. The tuning range n is then passed through at whose end the oscillator frequency again changes suddenly (jump B), until the initial value $f_{oo}$ is reached. Thereafter the oscillator frequency $f_o$ is independent of the transmitter frequency $f_s$.

Figure 4E:
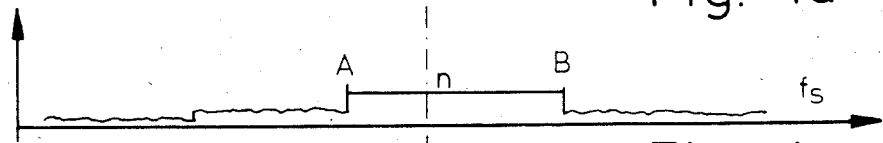

The behaviour of the signal at the input of the muting circuit 9 as a function of the transmitter frequency $f_s$ is illustrated by FIG. 4e. This Figure shows that the useful tuning range n is located approximately symmetrically to the transmitter frequency $f_s$, at which the correct tuning occurs.

Figure 4F:
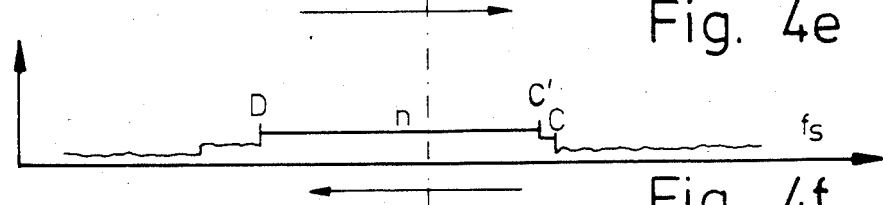

If instead thereof the tuning range n is passed through, starting from higher transmitter frequencies $f_s$, the attenuation 13 is at first fully operative so that the curve y determines the behaviour of the circuit. When the transmitter frequency $f_s$ is so low that the resulting intermediate frequency signal $f_z$ passes, at least partly, the low-pass filter and consequently a portion with a positive loop gain is reached, a jump C occurs again in the useful tuning range n, the attenuation however still being operative. Not until the transmitter frequency $f_z$ is decreased to such a low value that the signal $U_1$ falls short of the signal $U_2$ (FIG. 4b) does the initial loop gain become operative and a new frequency jump C' is effected. Thereafter the remaining portion of the tuning range n is passed through again until the difference between the transmitter frequency $f_s$ and the oscillator frequency $f_o$ has become so great that the voltage $U_1$ again exceeds the reference voltage $U_2$ and the attenuation of the attenuator 13 is effective again. Then a jump D (FIGS. 4a and 4c) is effected, until the region s is reached whereafter the oscillator frequency gradually decreases again to the initial value $f_{oo}$. The resulting tuning behaviour as a function of the transmitter frequency $f_s$ is shown in FIG. 4f. It will be obvious that the region c of FIG. 2e, in which no signal is applied to the muting circuit 9 is omitted, as are also the regions a and b of FIG. 2d and FIG. 4e.

It has therefore proved successful to improve the tuning behaviour of the circuit by controlling the loop gain in dependence on the intermediate frequency $f_z$. The residual disturbances (frequency jumps A, ... D, fringe tuning s and noise d, e) can be suppressed by the muting circuit, in correspondence with the prior art circuit disclosed in U.S. Pat. No. 4,426,735, hereby incorporated by reference. It is not necessary for the muting circuit 9 to completely suppress the signal but it is sufficient when the signal is attenuated to a considerable extent. As is also the case in the prior art circuit, a switch to an artificial noise generator can be made, when the intermediate frequency $f_z$ deviates from its target mean value $f_{zo}$ by a predetermined amount.

It is not absolutely necessary for the attenuator 13 to be arranged between the limiter-amplifier 8 and the low-pass filter 7. It must only be arranged such that the loop gain can be influenced. It is also not necessary for the signal in the loop to pass the attenuator 13. It is on the contrary sufficient when the gain of one of the circuits, for example, the FM demodulator 6, is controlled by the attenuator in such manner that the loop gain is changed. FIG. 5 shows an example of such a FM-demodulator.

This demodulator is what is commonly referred to as a quadrature demodulator, which comprises four transistors 21 ... 24 arranged as a cross-coupled differential amplifier. Each transistor has one electrode—and only this one electrode—in common with the three other transistors. The input voltage, that is to say the intermediate frequency signal $f_z$ is applied to this circuit between the interconnected bases of the transistors 21 and 24 and the transistors 22 and 23 the other hand through the terminals 25. The emitter currents for the transistors 21 and 22 and also 23 and 24 are supplied by a transistor 26 and 27, respectively whose emitters are also interconnected. The base electrodes are connected to the second input 35. The intermediate frequency signal $f_z$ is applied to input 35—however with a phase shift which depends linearly on the instantaneous frequency of the intermediate frequency signal, the phase shift being 90° at the target mean value $f_{zo}$. A direct current source 28 is included in the common emitter lead of the transistors 26 and 27. The input voltages applied to the input terminals 25 and 35 are multiplied by the circuit formed by the transistors 21 ... 27 and the direct current source 28, so that at the interconnected collectors of the transistors 22 and 24 a collector-signal current is produced proportional to the product of the intermediate-frequency input signals. The collector-signal current produces at a resistor 29 which is arranged between the said collectors and a positive supply voltage terminal a signal voltage which can be taken off from output 30. A capacitor 31 which is arranged in parallel with the resistor 29 operates together with this resistor 24 as a low-pass filter, so that a separate low-pass filter 7 is not required. The time constant of the RC-network 29, 31 must, however, adequately dimensioned.

For this demodulator the amplitude of the output signal also depends on the direct current from the direct current source 28, and more specifically, the amplitude is greater the greater this direct current is. The gain of such a demodulator can therefore be reduced by shunting a portion of the direct current. The two transistors 32 and 33 whose emitter terminals are interconnected and connected to the emitter terminals of the transistors 26 and 27 by a resistor 34 are used for this purpose. A control voltage $U_3$ which may be derived from the output voltage of the control circuit 11 or the amplifier 14, respectively is applied to the interconnected base electrodes of the transistors 32 and 33. If the voltage $U_3$ is positive compared with the voltage at the input of the transistors 35, a portion of the direct current produced by the direct current source 28 is shunted by the resistor 34 and the two transistors, the direct current portion being equally divided over the two transistors. This results in a lower gain of the demodulator and therewith in a reduced loop gain. If in contrast therewith the voltage $U_3$ is lower than the d.c. voltage at the base terminals of the transistors 26 and 27, substantially no direct current is shunted and a higher demodulator gain and therewith a higher loop gain, is obtained.

In principle, one single transistor would be sufficient to vary the demodulator gain. However, the d.c. voltage level at the output 30 would then vary, which would result in an unwanted D.C. level shift in the loop. This shift is obviated as one half of the shunted direct current of the direct current source 28 is applied to the output of the FM demodulator by the transistor 33 whose collector is connected via the output 30 to the resistor 29. The other half of the shunted direct current passes the collector of the transistor 32, which is connected to the positive supply voltage, so that this portion of the current does not effect the operating point. That half of the shunted direct current taken off from the direct current input of the demodulator and passing through the transistor 33 and the resistor 29 accurately compensates for the reduction in the collector-direct current of the transistors 22 and 24 which also passes through the resistor 29, because the direct current supplied by the direct current source 28 to the transistors 26 and 27 is uniformly distributed over the four transistors 21 ... 24. In other words, when the demodulator gain is reduced, the current passing through the transistor 33 is increased by the same amount by which the sum of the collector direct currents of the transistors 22 and 24 is reduced, so that the d.c. voltage level at the output 30 is independent of the demodulator gain.

In the circuit shown in FIG. 5, the attenuator is formed by the transistors 32 and 33 together with the resistor 34. Only a direct current flows through this attenuator so that the signal in the loop cannot be distorted by it. When the direct current level at the output of the control circuit 11 and also the amplitude of the signal $U_1$ produced by it are chosen adequately, the transistors 32 and 33 may alternatively be controlled by the control circuit 11. In this case the additional cost compared to the prior art circuit of FIG. 1 is only formed by the transistors 32 and 33 and the resistor 34. Then, when the intermediate frequency changes, the demodulator gain would not change suddenly, but more or less smoothly and continuously. This however does not deteriorate the function of the circuit.

So far it has been assumed that the control circuit 11 was formed by a correlator—as is also the case in the prior art circuit disclosed in U.S. Pat. No. 4,426,735, hereby incorporated by reference. FIG. 6a shows another embodiment of such a control circuit. Therein the output voltage $U_d$ of the demodulator 6 whose variation as a function of the difference $f_s - f_o$ is illustrated in an idealized manner in FIG. 6b is applied to the input of a circuit 40 for measuring the absolute signal amplitude, and at whose output the signal shown in FIG. 6c is consequently obtained. Such circuits for measuring the absolute signal amplitude of a FM demodulator output signal are known per se from DE-B No. 29 09 520. The output voltage of the circuit 40 is applied through a low-pass filter 41 whose time constant is preferably significantly higher than the time constant of the low-pass filter 7, to the attenuator 13 either directly or by the comparator amplifier 14 (FIG. 3), for which the reference voltage $U_2$ at the input 15 is chosen adequately.

Thus, there is described one embodiment of the invention for improving the tuning characteristics of a receiver having a frequency control loop. Those skilled in the art will recognize yet other embodiments defined by the claims which follow.

What is claimed is:

1. In a receiver circuit comprising a local oscillator which is included in a frequency control loop, said loop further including a mixer for receiving an aerial signal and said local oscillator signal to produce an intermediate frequency signal, a frequency-to-voltage converter for receiving said intermediate frequency signal and connected to provide a control voltage to said local oscillator proportional to the deviation of the frequency of said intermediate frequency signal from a target mean value $f_{zo}$, a circuit for improving the tuning characteristics of said receiver comprising:

a controlled attenuator for reducing the gain of said frequency control loop; and a control circuit for continuously varying the attenuation level of said attenuator in response to the difference of said intermediate frequency and said target mean value, said control circuit increasing said attenuation level as said frequency difference exceeds a predetermined value to a value less than the maximum loop gain, said control circuit comprising a correlator correlating said intermediate frequency signal with itself for a correlation period corresponding to half a period of said target mean value.

2. A receiver circuit as claimed in claim 1 further comprising a muting circuit for at least partially suppressing a baseband signal provided by said frequency-to-voltage converter, and the control circuit controlling the muting circuit such that the muting circuit is activated when the intermediate frequency ($f_z$) differs by a predetermined amount from the target means value ($f_{zo}$).

3. A receiver circuit as claimed in claim 1 wherein the output of the correlator is coupled to an input of a comparator circuit having a second input receiving a reference voltage ($U_2$), and the output of the comparator circuit is connected to the attenuator.

4. A receiver circuit as claimed in claim 1, wherein the frequency-to-voltage converter comprises a multiplying circuit incorporating said controlled attenuator.

5. A receiver circuit as claimed in claim 4, wherein the multiplying circuit output signal varies with a direct current applied thereto and that the attenuator provides a shunting-path for shunting a portion of said direct current.

6. A circuit claimed in claim 5, in which the direct current voltage level at the output of the multiplying circuit is determined by the direct current applied to the multiplying circuit, that portion of the shunted direct current flowing through the attenuator being applied at least partially to the output of the multiplying circuit.

* * * * *